(12) United States Patent
Kirimura et al.

(10) Patent No.: US 6,383,896 B1
(45) Date of Patent: May 7, 2002

(54) THIN FILM FORMING METHOD AND THIN FILM FORMING APPARATUS

(75) Inventors: Hiroya Kirimura; Naoto Kuratani; Kiyoshi Ogata, all of Kyoto (JP)

(73) Assignee: Nissan Electric Co., Ltd., Kyoto (JP)

( * ) Notice: Subject to any disclaimer, the term of this patent is extended or adjusted under 35 U.S.C. 154(b) by 0 days.

(21) Appl. No.: 09/661,809

(22) Filed: Sep. 14, 2000

(30) Foreign Application Priority Data

Sep. 16, 1999 (JP) ............................. 11-261932

(51) Int. Cl.$^7$ ........................... H01L 21/20; H01L 21/36
(52) U.S. Cl. ........................... 438/478; 438/659
(58) Field of Search ........................ 438/478, 487, 438/488, 659, 676, 685, 728, 787, 662, 795, 798

(56) References Cited

U.S. PATENT DOCUMENTS 5,099,790 A * 3/1992 Kawakami ............... 118/723
5,556,472 A * 9/1996 Nakamura et al. ........ 118/719
5,721,021 A * 2/1998 Tobe et al. ................ 427/570

FOREIGN PATENT DOCUMENTS

| EP | 921556 A2 | * | 6/1999 |
| JP | 03100178 A | | 4/1991 |
| JP | 2001081570 A | * | 3/2001 |

* cited by examiner

*Primary Examiner*—David Nelms
*Assistant Examiner*—Phuc T. Dang
(74) *Attorney, Agent, or Firm*—Arent Fox Kintner Plotkin & Kahn, PLLC

(57) ABSTRACT

In a thin film forming method and an apparatus A for implementing the method, a deposition chamber 1 provided with a substrate holder 12 and a radical emitting device 2 continuing to the chamber 1 for emitting neutral radicals uniformly to a whole deposition target region of a deposition target substrate S held by the holder 12 are used. Deposition gas plasma PL1 is formed at the vicinity of the substrate S on the holder 12 by supplying a predetermined deposition gas into the chamber 1. Neutral radicals RA are produced by exciting and dissociating a predetermined radical material gas in the radical emitting device 2, and the radicals are uniformly emitted to the deposition target region of the substrate S for forming a predetermined thin film on the substrate S.

21 Claims, 4 Drawing Sheets

US 6,383,896 B1

THIN FILM FORMING METHOD AND THIN FILM FORMING APPARATUS

The invention is based on patent application No. 11-261932 Pat. filed in Japan, the contents of which are hereby incorporated by reference.

BACKGROUND OF THE INVENTION

1. Field of the Invention

The present invention relates to a method and an apparatus for forming a thin film.

2. Description of the Background Art

Thin films have been produced for various purposes by various methods, and a plasma CVD method is one of typical methods of forming thin films.

A silicon film is an example of the thin film formed by the plasma CVD method. This silicon film is a material of a TFT (Thin-Film Transistor) switch provided in each pixel, e.g., of a liquid crystal display. A silicon oxide film and a silicon nitride film as well as a silicon-containing thin film used, e.g., in a solar battery are also examples of the thin films.

For example, the silicon film formation by the plasma CVD method is performed in such a manner that a silane gas and a hydrogen gas are mixed together, and a radio-frequency power is applied to an electrode opposed to a deposition target substrate for causing decomposition and dissociation of the gas mixture so that an amorphous silicon film is formed on the substrate.

In the case of the silicon oxide film, an oxygen-containing gas such as an oxygen gas is mixed with a silicon-containing gas such as a silane gas, and the radio-frequency power is likewise applied to cause dissociation and decomposition of the gas mixture so that the silicon oxide film is formed on the substrate.

FIG. 4 is a schematic cross section of an example of a parallel plate type plasma CVD apparatus in the prior art.

A parallel plate type plasma CVD apparatus B shown in FIG. 4 includes a vacuum casing C', which contains a deposition chamber 9, a flat plate electrode 91 having a plurality of gas-passage apertures, and a gas retaining chamber 92 connected to the deposition chamber 9 via the plate electrode 91.

The casing C' further includes a gas supply pipe 93 for supplying a deposition gas (i.e., a gas for film deposition) into the gas retaining chamber 92, a radical material gas supply pipe 94 for supplying a radical material gas into the gas retaining chamber 92, a gas outlet 95, a substrate inlet/outlet opening 96 provided with a gate value GA' for transferring the deposition target substrate S' into and from the chamber 9, and a substrate holder 97 which is vertically movable and can hold the deposition target substrate S' during the deposition. The holder 97 is internally provided with a heater H for heating the substrate. The electrode 91 is opposed to the substrate holder 97, and the gas retaining chamber 92 is located above the electrode 91. An electrically conductive porous plate 98 for preventing excessive generation of gas plasma in the gas retaining chamber 92 is arranged above the electrode 91.

A vacuum pump or gas discharging device 951 for achieving a predetermined low pressure in the deposition chamber is connected to the gas outlet 95.

The substrate holder 97 and the vacuum casing C' are grounded. In the plasma CVD apparatus B, the deposition gas and the radical material gas supplied thereto are mixed in the gas retaining chamber 92, and are supplied into the deposition chamber 9 through the conductive porous plate 98 and the parallel plate electrode 91. The electrode 91 is connected to a radio-frequency power source PS9 via a matching box MB9. When turned on, the power source PS9 supplies the power to the electrode 91 so that the plasma PL9 of the gas mixture is formed, and the film can be formed on the deposition target substrate S'.

However, when the gas mixture formed of the gases which have different dissociation energies, respectively, is excited by the radio-frequency power, the gas molecules (e.g., silane molecules) having a lower dissociation energy are dissociated with a higher priority, and the degree of dissociation of hydrogen- or oxygen-containing gas is low.

When forming the silicon film or the silicon oxide film, a higher density of the hydrogen radicals or oxygen radicals having a low energy can provide the film of a high quality. However, the conventional plasma CVD cannot achieve a high density of the hydrogen or oxygen radicals, and therefore cannot provide the film of a good quality.

For increasing the density of the hydrogen radicals or oxygen radicals, the radio-frequency power for forming the gas plasma may be increased. However, this increases the plasma potential, and causes excessive dissociation of the silane gas so that fast ions are produced, and therefore damages by ion collision are caused in the film. Accordingly, it is impossible to form the film of a low defect and a high quality.

An ECR-CVD method has been proposed as a method for obtaining the good quality. In this method, a microwave dissociates a gas such as a hydrogen or oxygen gas having a high dissociation energy in an ECR plasma source, and hydrogen or oxygen radicals are emitted to the substrate while supplying a silane gas to a portion near the substrate so that the silicon film or the silicon oxide film is formed on the substrate.

According to this method, a film of a good quality can be obtained without causing excessive dissociation of the silane gas. However, it is impossible to form a uniform film over a large area due to the structure of the ECR plasma source, and it is impossible to satisfy a current demand for increase in size of the deposition target substrates.

SUMMARY OF THE INVENTION

An object of the invention is to provide a thin film forming method and a thin film forming apparatus, in which a deposition gas and a radical material gas having different dissociation energies are used for forming a film, and dissociation of each gas is controlled to suppress generation of a large amount of ions due to excessive dissociation of each gas as well as a high plasma potential causing damages on the films so that the film of a high quality can be formed uniformly over a large area.

The invention provides the following thin film forming methods and apparatuses.

(1) Thin Film Forming Method

A thin film forming method for forming a predetermined thin film on a deposition target substrate, including the steps of:

preparing a deposition chamber provided with a substrate holder, and a radical emitting device continuing to the deposition chamber for emitting neutral radicals uniformly to a whole deposition target region of the deposition target substrate held by the substrate holder;

arranging the deposition target substrate on the substrate holder;

forming deposition gas plasma at the vicinity of the deposition target substrate arranged on the substrate holder by supplying a predetermined deposition gas into the deposition chamber; and producing neutral radicals by exciting and dissociating a predetermined radical material gas in the radical emitting device, and uniformly emitting the radicals to the deposition target region of the deposition target substrate.

(2) Thin Film Forming Apparatus

A thin film forming apparatus including:

a deposition chamber;

a radical emitting device continuing to the deposition chamber;

a substrate holder arranged in the deposition chamber; and a deposition gas plasma producing device for forming plasma of a predetermined deposition gas at the vicinity of a deposition target substrate arranged on the substrate holder, wherein the radical emitting device is opposed to a whole deposition target region of the deposition target substrate arranged on the substrate holder, produces neutral radicals by exciting and dissociating a predetermined radical material gas, and emitting the radicals uniformly to the whole deposition target region of the substrate.

According to the thin film forming method and apparatus of the invention, the deposition target substrate is arranged on the substrate holder in the deposition chamber. The plasma is formed from the deposition gas supplied into the deposition chamber. The radical emitting device is supplied with the radical material gas, and the neutral radicals are produced therefrom by exciting and dissociating the radical material gas independently of formation of the deposition gas plasma. A predetermined thin film is formed on the deposition target substrate by the deposition gas plasma and the neutral radicals emitted from the neutral radical emitting device.

For forming the thin film, the deposition gas and the radical material gas having different dissociation energies are used. These gases are excited and dissociated independently of each other in the deposition chamber and the radical emitting device, respectively. Accordingly, the dissociation of each gas is controlled to maintain the low plasma potential near the deposition target substrate, and generation of fast ions and fast electrons as well as injection thereof into the deposition target substrate are suppressed. A desired plasma density is maintained near the deposition target substrate, and also the neutral radicals required for the deposition can be efficiently emitted into the deposition target substrate. This enables formation of the film of a high quality.

Furthermore, the neutral radicals are emitted from the radical emitting device uniformly to the whole deposition target region of the deposition target substrate, and thereby a predetermined thin film can be formed uniformly over a large area of the large deposition target substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
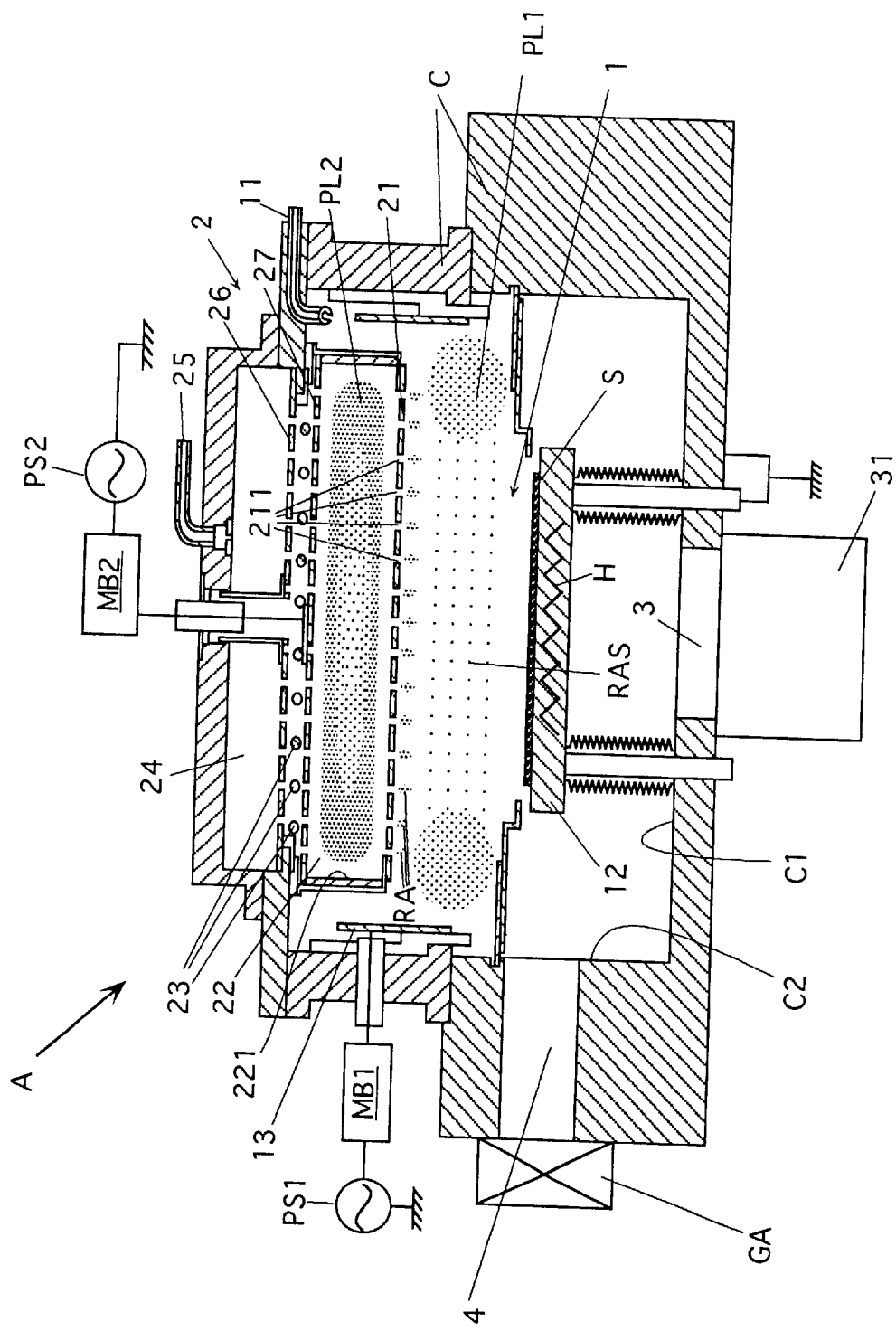
FIG. 1 is a schematic cross section of an example of a thin film forming apparatus according to the invention, and particularly a radical emission plasma CVD apparatus.

According to an embodiment of the invention, a thin film forming method for forming a predetermined thin film on a deposition target substrate, includes the steps of:

preparing a deposition chamber provided with a substrate holder, and a radical emitting device continuing to the deposition chamber for emitting neutral radicals uniformly to a whole deposition target region of the deposition target substrate held by the substrate holder;

arranging the deposition target substrate on the substrate holder;

forming deposition gas plasma at the vicinity of the deposition target substrate arranged on the substrate holder by supplying a predetermined deposition gas into the deposition chamber; and producing neutral radicals by exciting and dissociating a predetermined radical material gas in the radical emitting device, and uniformly emitting the radicals to the deposition target region of the deposition target substrate.

Also, according to an embodiment of the invention, a thin film forming apparatus includes:

a deposition chamber; a radical emitting device continuing to the deposition chamber; a substrate holder arranged in the deposition chamber; and a deposition gas plasma producing device for forming plasma of a predetermined deposition gas at the vicinity of a deposition target substrate arranged on the substrate holder.

The radical emitting device is opposed to a whole deposition target region of the deposition target substrate arranged on the substrate holder, produces neutral radicals by exciting and dissociating a predetermined radical material gas, and emitting the radicals uniformly to the whole deposition target region of the substrate.

In the thin film forming method, the formation of the deposition gas plasma at the vicinity of the deposition target substrate in the deposition chamber is executed such that the radical emission from the radical emitting device to the deposition target substrate is not impeded, and in the thin film forming apparatus, the deposition gas plasma forming device is a device such that the radical emission from the radical emitting device to the deposition target substrate is not impeded.

The thin film forming method can be applied, e.g., to such cases that the plasma is formed from the deposition gas (i.e., the gas for deposition) by applying a gas plasma formation power (i.e., an electric power for forming the gas plasma) across paired electrodes of a parallel plate type arranged not to impede the radical emission, and that the plasma is formed from the deposition gas by applying the gas plasma formation power to a cylindrical electrode or an annular electrode opposed to the periphery of the deposition target substrate.

The thin film forming apparatus may employ the deposition gas plasma forming device, which includes aforementioned pair of electrodes of the parallel plate type for applying the gas plasma formation power, or the deposition gas plasma forming device, which includes the cylindrical electrode or annular electrode opposed to the periphery of the deposition target substrate arranged on the substrate holder for applying the gas plasma formation power.

In the structure employing the cylindrical or annular electrode, the plasma of the deposition gas can be formed primarily in a region opposed to the periphery of the deposition target substrate, whereby it is possible to suppress injection of fast charged particles such as ions into the deposition target substrate, and the film of a good quality having less damages can be formed.

A typical example of the radical emitting device may have an electrically insulating porous plate opposed to the whole deposition target region of the deposition target substrate on the substrate holder for uniformly emitting radicals to the whole deposition target region.

The electrically insulating porous plate can suppress movement of the charged particles such as ions toward the deposition chamber, which may be caused due to charging of the porous plate. Thereby, damages of the film by the charged particles is suppressed, and the movement of the neutral radicals to the deposition target substrate is not impeded.

In a further specific example, the radical emitting device may include the electrically insulating porous plate opposed to the whole deposition target region of the deposition target substrate arranged on the substrate holder for emitting the radicals uniformly to the whole deposition target region, the radical producing chamber partitioned off by the porous plate with respect to the deposition chamber, and a radical material gas excitation and dissociation device for achieving the excited and dissociated state of the radical material gas entirely in the radical producing chamber.

In this case, the radical producing chamber may be formed of a space surrounded by an electrically insulating wall partially formed of the electrically insulating porous plate for the radical emission, and the radical material gas excitation and dissociation device may include an electrode for applying the gas plasma formation power entirely to the radical material gas supplied to the radical production chamber.

Owing to the structure in which the radical producing chamber is formed of the space surrounded by the electrically insulating wall partially formed of the electrically insulating porous plate for the radical emission, the lifetime of the radicals can be increased. Also, the charged particles such as ions can be confined within the radical producing chamber while allowing movement of the neutral radicals to the deposition target substrate.

The radical producing chamber may be formed of a space surrounded by the electrically insulating porous plate for the radical emission, an electrically insulating porous plate opposed to the porous plate for the radical emission with a predetermined distance therebetween for supplying the radical material gas into a region between these porous plates, and an electrically insulating peripheral wall surrounding the region between these porous plates.

The electrically insulating porous plate for supplying the radical material gas is desirably configured to allow uniform supply of the radical material gas into the radical producing chamber.

The electrode for applying the gas plasma formation power entirely to the radical material gas supplied into the radical producing chamber may be a radio-frequency inductive electrode of a spiral form.

This spiral electrode may be arranged outside the radical producing chamber, and may be opposed to the electrically insulating porous plate for the radical material gas supply.

For avoiding unnecessary excitation and dissociation of the radical material gas outside the radical producing chamber, an electrically conductive porous plate may be further arranged outside the electrode. Desirably, this porous plate can supply the radical material gas uniformly into the radical producing chamber through the electrically insulating porous plate for the radical material gas supply.

The radical material gas excitation and dissociation device is not restricted to the structure for forming the gas plasma by application of the radio-frequency power, and may be of a structure of a filament type utilizing filaments for emitting thermoelectrons, a structure using microwaves or the like.

The deposition gas and the radical material gas can be selected in accordance with the film to be formed. For example, a silicon-containing gas may be used as the deposition gas, and a reactive radical material gas may be used as the radical material gas so that a silicon-containing thin film can be formed.

The silicon-containing gas may be a silicon hydride gas such as $SiH_4$ or $Si_2H_6$, a silicon fluoride gas such as $SiF_4$, a silicon chloride gas such as $SiCl_4$, or a TEOS gas.

The radical material gas may be a reactive radical material gas such as a gas containing at least one of oxygen, nitrogen, hydrogen and carbon, or a gas containing at least two of them.

Formation of the plasma from the deposition gas in the deposition chamber as well as the excitation and dissociation of the radical material gas in the radical emission device can be performed by applying the radio-frequency power to these gases to form the plasma therefrom.

In any case, (but particularly in the case where the radical emitting device includes the electrically insulating porous plate opposed to the whole deposition target region of the deposition target substrate arranged on the substrate holder for suppressing outflow of fast ions or the like, and configured to emit the radicals uniformly to the whole deposition target region), the radical emitting device may be configured to produce sufficiently the neutral radicals required for the deposition in the radical emitting device, and for this purpose, may be configured such that the radio-frequency power applied for the formation of the plasma from the radical material gas may be larger than the radio-frequency power supplied for the formation of the plasma from the deposition gas in the deposition chamber.

For obtaining the deposition gas plasma density required for the deposition while suppressing generation of fast ions and others which may damage the film in the deposition chamber, formation of the plasma from the deposition gas may be performed such that the radio-frequency power applied for the deposition gas plasma formation in the deposition chamber is kept at a magnitude suppressing generation of the charged particles causing the film damage, and is kept at a frequency higher than the frequency of the radio-frequency power supplied for the radical material gas plasma formation in the radical emitting device.

The radical emission from the radical emitting device may be started either before or after, or at the same time as the start of the deposition gas plasma formation in the deposition chamber, depending on the film to be formed. For the purposes of, e.g., improving the interface coupling between the substrate and the film, the film deposition may be performed after the deposition target substrate surface is subjected to the surface modification (e.g., cleaning or surface defect removing) with neutral radicals. For the same purposes, processing may be performed to couple neutral radicals to dangling bonds on the surface of the deposition target substrate before the deposition. In these cases, the predetermined thin film may be formed by forming the plasma from the deposition gas after starting the radical emission by the radical emitting device.

For example, a silicon-containing gas may be used as the deposition gas, and a reactive radical material gas may be used as the radical material gas for forming the silicon-containing thin film. In this case, the plasma of the deposition gas may be formed after start of the radical emission from the radical emitting device for forming the predetermined silicon-containing thin film of a good quality.

Embodiments of the invention will now be described below with reference to the drawings.

FIG. 1 is a schematic cross section of a radical emission plasma CVD apparatus, which is an example of the thin film forming apparatus.

The radical emission plasma CVD apparatus A shown in FIG. 1 includes a vacuum casing or vacuum box C. The casing C has a deposition chamber 1, a radical emitting device 2, a gas outlet 3 and a substrate inlet/outlet opening 4 for transferring a deposition target substrate S into and from the deposition chamber 1. The radical emitting device 2 continues to the deposition chamber 1 for forming plasma and emitting neutral radicals in the plasma thus produced into the deposition chamber 1.

The deposition chamber 1 includes a deposition gas supply pipe 11 for supplying a deposition gas into the deposition chamber 1, a substrate holder 12 which can be vertically moved by drive means (not shown), and a cylindrical electrode 13 for forming the deposition gas plasma at the vicinity of the deposition target substrate S arranged on the substrate holder 12.

The substrate holder 12 is grounded, and has a heater H for heating the substrate S. The cylindrical electrode 13 has a cylindrical form arranged along an inner surface of a side wall of the deposition chamber 1, and is configured not to impede emission of radicals from the radical emitting device 2. The cylindrical electrode 13 is connected to a radio-frequency power source PS1 via a matching box MB1.

The deposition gas supply pipe 11 is located above the cylindrical electrode 13, and supplies the deposition gas into the deposition chamber. By using the cylindrical electrode 13, the plasma of the deposition gas is produced near the electrode 13, and thereby suppresses injection of fast ions into the substrate S. Also, the cylindrical electrode 13 does not impede the radicals emitted from the device 2, and a sufficient amount of radicals can reach the substrate S so that the thin film of a good quality can be deposited.

The electrode 13, power source PS1 and others form a plasma producing device for the deposition gas supplied through the pipe 11.

The vacuum casing C is provided at its bottom C1 with the foregoing gas outlet 3, which is connected to a vacuum pump or gas discharging device 31 for discharging the gas to attain a predetermined low pressure in the casing C. The vacuum casing C is provided at its side wall C2 with the substrate inlet/outlet opening 4. A gate value GA is arranged outside the opening 4 of the side wall C2.

The radical emitting device 2 includes an electrically insulating porous plate 21 for emitting radicals uniformly to a whole deposition target region of the deposition target substrate S disposed on the substrate holder 12, a radical producing chamber 22 which is partitioned off by the porous plate 21 with respect to the deposition chamber 1, a radio-frequency inductive electrode (i.e., a spiral radio-frequency antenna) 23 of a spiral form for forming an excited and dissociated state of a radical material gas entirely in the radical producing chamber 22, a radical material gas retaining chamber 24 for temporarily retaining the radical material gas, and a radical material gas supply pipe 25 for supplying or introducing the radical material gas into the radical material gas retaining chamber 24.

An electrically insulating porous plate 27 parallel to the porous plate 21 is arranged above the porous plate 21, and an electrically insulating peripheral wall 221 is disposed between the porous plates 21 and 27. These plates and wall form the radical producing chamber 22.

Since the radical producing chamber 22 is surrounded by the electrically insulating materials, the neutral radicals in a plasma PL2 generated in the radical producing chamber 22 have a long lifetime and a high density in spite of the fact that radicals generally tend to disappear when approaching an electrical conductor. Owing to the electrically insulating porous plate 21, the charged particles which are produced when producing the plasma in the radical producing chamber 22 cannot pass the porous plate 21 because of the charged state, but the electrically neutral radicals can pass the porous plate 21.

The spiral radio-frequency inductive electrode 23 is arranged between the radical producing chamber 22 and the radical material gas retaining chamber 24, and the electrode 23 is connected to the radio-frequency power source PS2 via the matching box MB2. The electrode 23 is located outside the electrically insulating porous plate 27, and is opposed entirely to the radical producing chamber 22. An electrically conductive porous plate 26 spaced from the electrode 23 is arranged between the electrode 23 and the retaining chamber 24 for preventing the plasma formation in the retaining chamber 24. The electrically conductive porous plate 26 and the electrically insulating porous plate 27 enable uniform supply of the radical material gas from the radical material gas retaining chamber 24 into the whole area of the radical producing chamber 22. Provision of the electrically conductive porous plate 26 can suppress generation of the plasma in the gas retaining chamber 24. For increasing the lifetime and density of the radicals, it is preferable to surround the inner side of the radical producing chamber 22 by an electrically insulating material, and therefore the porous plate 27 is made of the electrically insulating material.

The spiral electrode 23 is the inductive electrode, and allows formation of the plasma on a large area. This can increase the area of the substrate on which the film is deposited.

The radical emission plasma CVD apparatus A described above can form the film on the deposition target substrate S in the following manner.

When starting an operation of transferring the substrate into the chamber 1, the substrate holder 12 is first in the lowered position, and a substrate transferring mechanism (not shown) transfers the substrate S through the inlet/outlet opening 4 onto the substrate holder 12. After the substrate transferring mechanism moved out of the vacuum casing C, the gate valve GA is closed, and the holder 12 is raised to the deposition position. Further, the gas discharging device 31 operates to attain the predetermined low pressure in the deposition chamber 1 and the radical emitting device 2.

Thereafter, the radical material gas is supplied through the radical material gas supply pipe 25 of the radical emitting device 2 into the radical material gas retaining chamber 24, and is kept therein. Further, the pressure of the flowing gas acts to flow the gas in the retaining chamber uniformly into the radical producing chamber 22 through the electrically conductive porous plate 26 and the electrically insulating porous plate 27. Also, the radio-frequency power source PS2 is turned on to supply the electric power to the spiral radio-frequency inductive electrode 23. In this manner, the radical material gas is excited and dissociated to produce the plasma PL2.

When the plasma PL2 is produced in the radical producing chamber 22, the charged particles, i.e., the electrons and ions cannot pass through the apertures 211 in the electrically insulating porous plate 21 without difficulty, and only the substantially electrically neutral radicals RA pass through the apertures 211, and are emitted into the deposition chamber 1. The radicals RA thus emitted uniformly reach the various portions in the deposition target region of the deposition target substrate S. In this example, the cleaning of the deposition target region, elimination of dangling bonds and others are performed first of all.

As described above, a predetermined amount of deposition gas is supplied from the deposition gas supply pipe 11 into the deposition chamber 1 after starting emission of the neutral radicals to the substrate S, and the radio-frequency power source PS1 is turned on so that the radio-frequency power is applied to the cylindrical electrode 13 via the matching box MB1 to produce the deposition gas plasma PL1. This plasma PL1 is primarily formed at the vicinity of the periphery of the substrate S. In this operation, the radio-frequency power applied to the cylindrical electrode 13 is higher in frequency and lower in magnitude than the radio-frequency power applied to the spiral radio-frequency inductive electrode 23. Thereby, the plasma potential of the deposition gas plasma PL1 can be kept at a low level, and injection of the fast ions into the substrate is suppressed so that the plasma density required for deposition of the thin film of a good quality can be obtained while suppressing damages to the substrate.

In the radical emitting device 2, the radio-frequency power applied to the radio-frequency electrode (radio-frequency antenna) 23 has a larger magnitude than the radio-frequency power applied to the cylindrical electrode 13 (and further, may have a lower frequency than the electrode 13), whereby a sufficient amount of radicals which are required for forming the thin film of a good quality are produced.

In this manner, the radical emitting device 2 can uniformly emit the neutral radicals to the whole deposition target region of the substrate S, and the deposition gas plasma is produced near the substrate S. Owing to these features, the thin film of a desired good quality can be formed on the substrate S.

After the film deposition on the deposition target substrate S is completed, the substrate holder 12 is lowered, the gate valve GA is opened, and the substrate transferring mechanism transfers the substrate S from the vacuum casing or vacuum box C.

Figure 2:
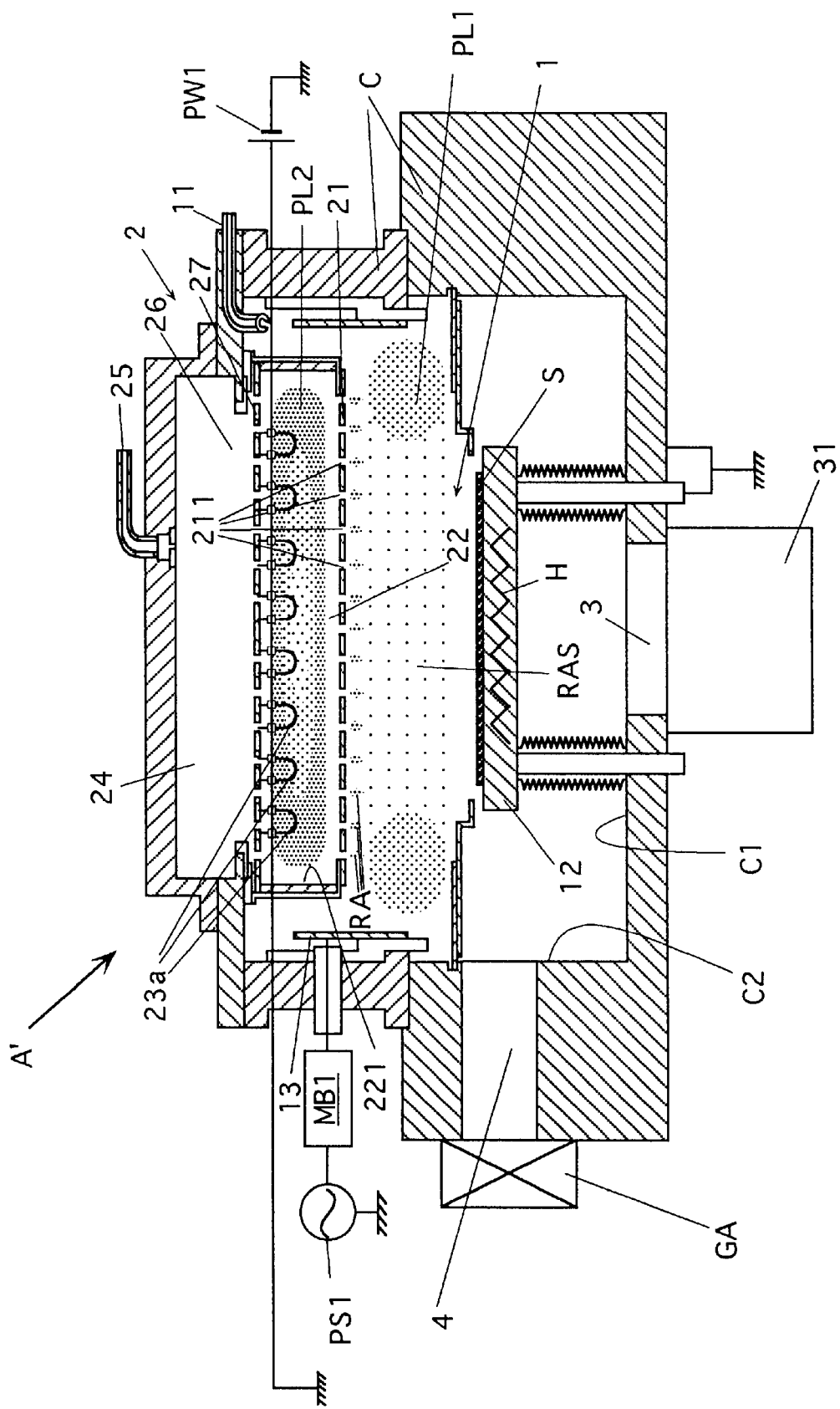
FIG. 2 is a schematic cross section of a modification of the radical emission plasma CVD apparatus shown in FIG. 1.
Figure 3:
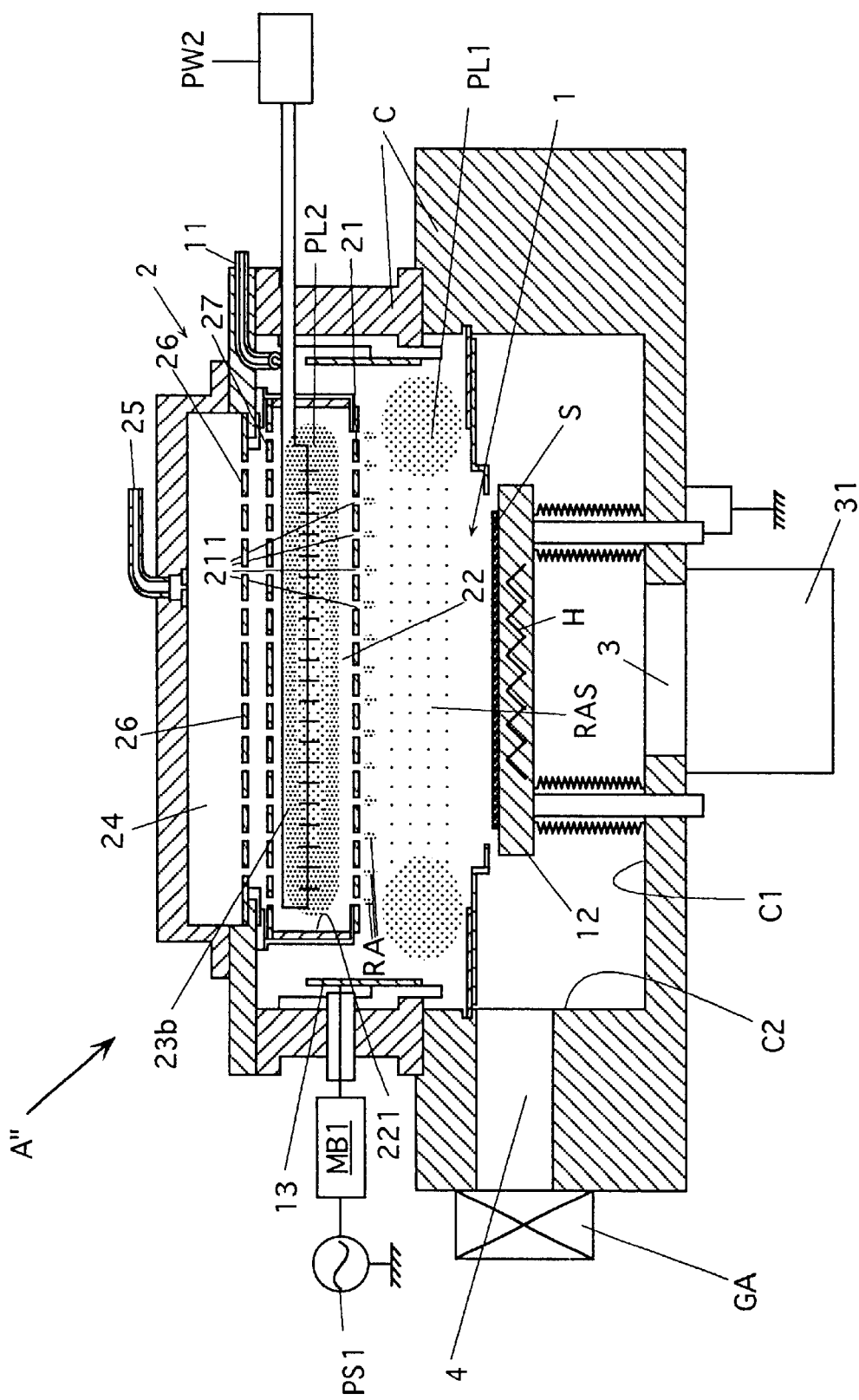
FIG. 3 is a schematic cross section of another modification of the radical emission plasma CVD apparatus shown in FIG. 1.

The radical emitting device 2 of the radical emission plasma CVD apparatus A uses the spiral radio-frequency inductive electrode 23 as the plasma producing device, but is not restricted to it. For example, a radical emission plasma CVD apparatus A' shown in FIG. 2 may be employed. In this apparatus A', the plasma producing device of the plasma emitting device uses filaments 23a, and the power source PW1 can supply the power to the filaments 23a. Also, a radical emission plasma CVD apparatus A" shown in FIG. 3 may be employed for forming the thin film. This apparatus A" uses a microwave generating device 23b which is supplied with the microwaves from a microwave source PW2. In each of the CVD apparatuses A' and A", structures other than the plasma producing device in plasma emitting device 2 are the substantially same as those of the CVD apparatus A. The same parts and portions bear the same reference numbers as the CVD apparatus A.

In the structure using the filaments 23a for producing the radical material gas plasma PL2, the filaments 23a are uniformly dispersed in the radical producing chamber 22, and the gas is excited and dissociated by directly discharging the thermoelectrons from the filaments 23a into the producing chamber 22 so that the plasma is not formed in the retaining chamber 24. Accordingly, the CVD apparatus A' does not require the electrically conductive porous plate 26 used in the plasma CVD apparatus A. In the structure using the microwave generating device 23b, the device 23b is configured to supply the microwave uniformly into the radical producing chamber 22. In the microwave generating device 23b shown in FIG. 3, a plurality of antennas are formed on the microwave guide in a uniformly dispersed fashion.

In the plasma CVD apparatus A shown in FIG. 1, the deposition chamber 1 and the radical emitting device 2 are arranged in the same vacuum casing C. However, these may be provided in different vacuum casings or vacuum boxes, respectively, which are connected together via the electrically insulating porous plate included in the radical emitting device. In other words, a structure in which the deposition chamber and the radical emitting device are connected together may be employed.

Description will now be given on experimental examples, in which the silicon films were formed on the substrates by the radical emission plasma CVD apparatus A shown in FIG. 1, respectively. Also, description will be given on comparative experimental example of deposition by the parallel plate type plasma CVD apparatus B shown in FIG. 4.

EXPERIMENTAL EXAMPLE 1

The radical emission plasma CVD apparatus A shown in FIG. 1 was used.
(1) Conditions of Plasma Formation from Deposition Gas
  Exciting method: radio-frequency excitation
    (frequency: 100 MHz, 100W)
  Gas species: $SiH_4$ (100%)
  Deposition gas pressure: $1\times10^{-3}$ Torr
(2) Neutral Radical Emission Conditions
  Exciting method: spiral radio-frequency inductive electrode
    (frequency: 27 MHz, 500 W)
  Radical material gas species: $H_2$
(3) Substrate S: non-alkaline glass substrate
  (W×L: 500 mm×600 mm)
(4) Substrate temperature: 300° C.
(5) Deposited Film Thickness: 500 Å

COMPARATIVE EXPERIMENTAL EXAMPLE 1

Figure 4:
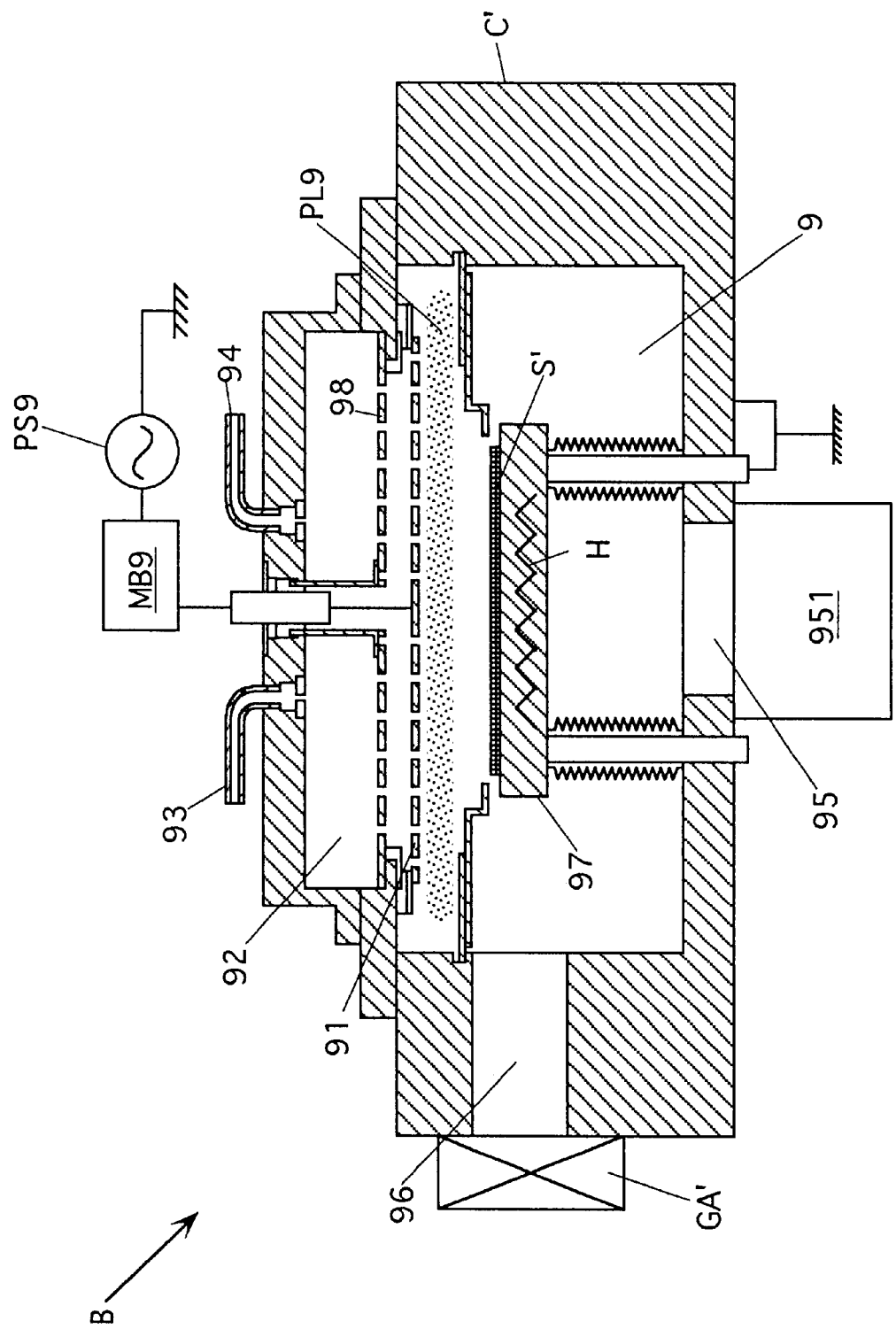
FIG. 4 is a schematic cross section of a parallel plate plasma CVD apparatus.

The parallel plate type plasma CVD apparatus B shown in FIG. 4 was used.
(1) Conditions of Gas Plasma Formation
  Exciting method: radio-frequency excitation
    (frequency: 13.56 MHz, 150W)
  Gas species: gas mixture of $SiH_4$ (50%) and $H_2$ (50%)
  Deposition gas pressure: $2\times10^{-1}$ Torr
(2) Substrate S': non-alkaline glass substrate Si-Wafer <100>
(3) Substrate temperature 300° C.
(4) Deposited Film Thickness: 500 Å

Measurement of the hydrogen concentration and evaluation of the crystallinity as well as measurement of electron mobility and evaluation of device characteristics were effected on the respective silicon films obtained in the experimental example 1 and the comparative experimental example 1 by Fourier Transformation Infrared spectroscopic analysis (FT-IR), X-ray diffraction analysis (XRD) and Laser Raman spectroscopic analysis.

FT-IR

Quantitative analysis of the hydrogen concentration in the film was performed based on the Si—H (Stretching-band) absorption peak integrated strength of a wave number of 2000 $cm^{-1}$. Each film sample in the experimental example 1 exhibited the result of $2\times10^{20}$ $cm^{-3}$ and the film sample in the comparative experimental example 1 exhibited the result of $2\times10^{22}$ $cm^{-3}$. Thus, the film sample obtained in the experimental example 1 had a remarkably smaller hydrogen concentration compared with the comparative experimental example 1.

XRD

In each film sample of the experimental example 1, peaks were detected on 111 plane ($2\theta=28.2°$) and 220 plane ($2\theta=47.2°$), and therefore the crystallinity of silicon (cubic) was confirmed. An amorphous structure was confirmed in the film sample of the comparative experimental example 1.

Laser Raman Spectroscopic Analysis

In each film sample of the experimental example 1, a peak (Raman shift=515 $cm^{-1}$–520 $cm^{-1}$) achieved by the crystallized silicon was detected, and crystal grains of 100 Å–2000 Å were recognized. In the film sample of the comparative experimental example 1, a peak (Raman shift= 480 $cm^{-1}$) achieved by the amorphous structure was detected.

Electron Mobility

The film sample of the comparative experimental example 1 exhibited the electron mobility of 0.1 $cm^2/V\cdot s$. In the experimental example 1, however, the film sample having the crystal grain diameter of 100 Å exhibited the electron mobility of 0.5 $cm^2/V\cdot s$, and the film sample having the crystal grain diameter of 2000 Å exhibited the electron mobility of 50 $cm^2/V\cdot s$.

Description will now be given on an experimental example, in which the silicon oxide film was formed on the substrate by the radical emission plasma CVD apparatus A shown in FIG. 1. Also, description will be given on a comparative experimental example of deposition by the parallel plate type plasma CVD apparatus B shown in FIG. 4.

EXPERIMENTAL EXAMPLE 2

The radical emission plasma CVD apparatus A shown in FIG. 1 was used.

(1) Conditions of Plasma Formation from Deposition Gas
  Exciting method: radio-frequency excitation
    (frequency: 100 MHz, 100W)
  Gas species: $SiH_4$ (100%)
  Deposition gas pressure: $1\times10^{-3}$ Torr
(2) Neutral Radical Emission Conditions
  Exciting method: spiral radio-frequency inductive electrode
    (frequency: 27 MHz, 500 W)
  Radical material gas species: gas mixture of $N_2O$ (50%) and $O_2$ (50%)
(3) Substrate S: N-type silicon wafer (12 inches in diameter)
(4) Substrate temperature: 300° C.
(5) Deposited Film Thickness: 1000 Å

COMPARATIVE EXPERIMENTAL EXAMPLE 2

The parallel plate type plasma CVD apparatus B shown in FIG. 4 was used.

(1) Conditions of Gas Plasma Formation
  Exciting method: radio-frequency excitation
    (frequency: 13.56 MHz, 200W)
  Gas species: gas mixture of $SiH_4$ (10%), $N_2O$ (45%) and $O_2$ (45%)
  Deposition gas pressure: $2\times10^{-1}$ Torr
(2) Substrate S': N-type silicon wafer
(3) Substrate temperature: 300° C.
(4) Film thickness: 1000 Å

C–V (capacity-voltage) measurement and I–V (current-voltage) measurement were effected on the silicon oxide films obtained by the experimental example 2 and the comparative experimental example 2, and thereby device characteristics were evaluated.

According to the C–V measurement, the film sample of the comparative experimental example 2 exhibited the defect density of $5\times10^{11}$ $cm^{-3}$. However, the film sample of the experimental example 2 exhibited the defect density of $5\times10^{10}$ $cm^{-3}$. Thus, the film sample obtained in the experimental example 2 had the remarkably lower defect density than the comparative experimental example 2.

According to the I–V measurement, the film sample of the comparative experimental example 2 exhibited the breakdown voltage of 7 MV/cm. However, the film sample of the experimental example 2 exhibited the breakdown voltage of 8 MV/cm. The film sample of the comparative experimental example 2 exhibited the leak current of $1\times10^{-11}$ $A/cm^2$. However, the film sample of the experimental example 2 exhibited the leak current of $1\times10^{-12}$ $A/cm^2$. Thus, the film sample obtained in the experimental example 2 had the remarkably higher breakdown voltage than that of the comparative experimental example 2, and could remarkably reduce the leak current, as compared with the comparative experimental example 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film forming method for forming a predetermined thin film on a deposition target substrate, comprising the steps of:
  preparing a deposition chamber provided with a substrate holder, and a radical emitting device continuing to said deposition chamber for emitting neutral radicals uniformly to a whole deposition target region of the deposition target substrate held by said substrate holder;
  arranging the deposition target substrate on said substrate holder;
  forming deposition gas plasma at the vicinity of the deposition target substrate arranged on said substrate holder by supplying a predetermined deposition gas into said deposition chamber; and
  producing neutral radicals by exciting and dissociating a predetermined radical material gas in said radical emitting device, and uniformly emitting the radicals to the deposition target region of said deposition target substrate.

2. The thin film forming method according to claim 1, wherein
  the formation of the deposition gas plasma at the vicinity of said deposition target substrate in said deposition chamber is performed by applying a gas plasma formation power to a cylindrical electrode or an annular electrode opposed to the periphery of said deposition target substrate.

3. The thin film forming method according to claim 1, wherein
said radical emitting device has an electrically insulating porous plate opposed to the whole deposition target region of the deposition target substrate on said substrate holder for uniformly emitting radicals to said whole deposition target region.

4. The thin film forming method according to claim 2, wherein
said radical emitting device has an electrically insulating porous plate opposed to the whole deposition target region of the deposition target substrate on said substrate holder for uniformly emitting radicals to said whole deposition target region.

5. The thin film forming method according to claim 1, wherein
formation of the plasma from the deposition gas in said deposition chamber as well as the excitation and dissociation of the radical material gas in said radical emitting device are performed by applying the radio-frequency power to each of said gases to form the plasma therefrom, and said radical emitting device is configured for the gas plasma formation such that a radio-frequency power applied for the formation of the plasma from the radical material gas is larger than a radio-frequency power supplied for the formation of the plasma from the deposition gas in said deposition chamber.

6. The thin film forming method according to claim 1, wherein
formation of the plasma from the deposition gas in said deposition chamber as well as the excitation and dissociation of the radical material gas in said radical emitting device are performed by applying the radio-frequency power to each of said gases to form the plasma therefrom, the gas plasma formation is performed such that the radio-frequency power applied for the deposition gas plasma formation in said deposition chamber is kept at a magnitude suppressing generation of charged particles causing the film damage, and is kept at a frequency higher than the frequency of the radio-frequency power supplied for the radical material gas plasma formation in said radical emitting device.

7. The thin film forming method according to claim 5, wherein
formation of the plasma from the deposition gas in said deposition chamber as well as the excitation and dissociation of the radical material gas in said radical emitting device are performed by applying the radio-frequency power to each of said gases to form the plasma therefrom, the gas plasma formation is performed such that the radio-frequency power applied for the deposition gas plasma formation in said deposition chamber is kept at a magnitude suppressing generation of charged particles causing the film damage, and is kept at a frequency higher than the frequency of the radio-frequency power supplied for the radical material gas plasma formation in said radical emitting device.

8. The thin film forming method according to claim 1, wherein
a silicon-containing gas is used as said deposition gas, and a reactive radical material gas is used as said radical material gas for forming the silicon-containing thin film.

9. The thin film forming method according to claim 1, wherein
the predetermined thin film is formed by forming the plasma of said deposition gas after start of the radical emission from said radical emitting device.

10. A thin film forming apparatus comprising:
a deposition chamber;
a radical emitting device continuing to said deposition chamber;
a substrate holder arranged in said deposition chamber; and
a deposition gas plasma producing device for forming plasma of a predetermined deposition gas at the vicinity of a deposition target substrate arranged on said substrate holder, wherein
said radical emitting device is opposed to a whole deposition target region of the deposition target substrate arranged on said substrate holder, produces neutral radicals by exciting and dissociating a predetermined radical material gas, and emitting the radicals uniformly to the whole deposition target region of said substrate.

11. The thin film forming apparatus according to claim 10, wherein
said deposition gas plasma producing device includes an electrode applying an electric power for forming the plasma from the deposition gas supplied into said deposition chamber, and said electrode is a cylindrical electrode or an annular electrode opposed to the periphery of the deposition target substrate arranged on said substrate holder.

12. The thin film forming apparatus according to claim 10, wherein
said radical emitting device has an electrically insulating porous plate opposed to the whole deposition target region of said deposition target substrate arranged on said substrate holder for uniformly emitting radicals to said whole deposition target region, a radical producing chamber partitioned off by said porous plate with respect to said deposition chamber, and a radical material gas excitation and dissociation device for achieving the excited and dissociated state of the radical material gas entirely in said radical producing chamber.

13. The thin film forming apparatus according to claim 11, wherein
said radical emitting device has an electrically insulating porous plate opposed to the whole deposition target region of said deposition target substrate arranged on said substrate holder for uniformly emitting radicals to said whole deposition target region, a radical producing chamber partitioned off by said porous plate with respect to said deposition chamber, and a radical material gas excitation and dissociation device for achieving the excited and dissociated state of the radical material gas entirely in said radical producing chamber.

14. The thin film forming apparatus according to claim 12, wherein
said radical producing chamber is formed of a space surrounded by an electrically insulating wall partially formed of said electrically insulating porous plate for the radical emission, and said radical material gas excitation and dissociation device includes an electrode for applying the gas plasma formation power entirely to the radical material gas supplied to said radical producing chamber.

15. The thin film forming apparatus according to claim 14, wherein said radical producing chamber is formed of a space surrounded by said electrically insulating porous plate for the radical emission, an electrically insulating porous plate opposed to said porous plate for the radical emission with a predetermined distance therebetween for supplying the radical material gas into a region between said porous plates, and an electrically insulating peripheral wall surrounding the region between said porous plates.

16. The thin film forming apparatus according to claim 15, wherein said radical material gas excitation and dissociation device includes, as an electrode for applying the gas plasma formation power entirely to said radical material gas, a radio-frequency inductive electrode of a spiral form arranged outside said radical producing chamber and opposed to the electrically insulating porous plate for the radical material gas supply.

17. The thin film forming apparatus according to claim 16, wherein an electrically conductive porous plate allowing supply of the radical material gas is opposed to said electrically insulating porous plate for the radical material gas supply with said spiral radio-frequency inductive electrode therebetween, a retaining chamber for the radical material gas is formed outside said conductive porous plate, and the radical material gas is supplied into said radical producing chamber through said retaining chamber, said conductive porous plate and said electrically insulating porous plate for the radical material gas supply forming said radical producing chamber.

18. The thin film forming apparatus according to claim 13, wherein said radical producing chamber is formed of a space surrounded by an electrically insulating wall partially formed of said electrically insulating porous plate for the radical emission, and said radical material gas excitation and dissociation device includes an electrode for applying the gas plasma formation power entirely to the radical material gas supplied to said radical producing chamber.

19. The thin film forming apparatus according to claim 18, wherein said radical producing chamber is formed of a space surrounded by said electrically insulating porous plate for the radical emission, an electrically insulating porous plate opposed to said porous plate for the radical emission with a predetermined distance therebetween for supplying the radical material gas into a region between said porous plates, and an electrically insulating peripheral wall surrounding the region between said porous plates.

20. The thin film forming apparatus according to claim 19, wherein said radical material gas excitation and dissociation device includes, as an electrode for applying the gas plasma formation power entirely to said radical material gas, a radio-frequency inductive electrode of a spiral form arranged outside said radical producing chamber and opposed to the electrically insulating porous plate for the radical material gas supply.

21. The thin film forming apparatus according to claim 20, wherein an electrically conductive porous plate allowing supply of the radical material gas is opposed to said electrically insulating porous plate for the radical material gas supply with said spiral radio-frequency inductive electrode therebetween, a retaining chamber for the radical material gas is formed outside said conductive porous plate, and the radical material gas is supplied into said radical producing chamber through said retaining chamber, said conductive porous plate and said electrically insulating porous plate for the radical material gas supply forming said radical producing chamber.

* * * * *

UNITED STATES PATENT AND TRADEMARK OFFICE
CERTIFICATE OF CORRECTION

PATENT NO.    : 6,383,896 B1
DATED         : October 17, 2002
INVENTOR(S)   : Kirimura et al.

It is certified that error appears in the above-identified patent and that said Letters Patent is hereby corrected as shown below:

<u>Title page,</u>
Item [73], please change the spelling of the Assignee's name from "Nissan" to -- Nissin --.

Signed and Sealed this

Fourth Day of February, 2003

JAMES E. ROGAN
*Director of the United States Patent and Trademark Office*